(12) United States Patent
Ponce et al.

(10) Patent No.: US 8,529,698 B2
(45) Date of Patent: Sep. 10, 2013

(54) INGAN COLUMNAR NANO-HETEROSTRUCTURES FOR SOLAR CELLS

(75) Inventors: Fernando A. Ponce, Tempe, AZ (US); Rafael Garcia, Hermosillo (ME)

(73) Assignee: Arizona Board Of Regents For And On Behalf Of Arizona State University, Scottsdale, AZ (US)

( * ) Notice: Subject to any disclaimer, the term of this patent is extended or adjusted under 35 U.S.C. 154(b) by 598 days.

(21) Appl. No.: 12/616,634

(22) Filed: Nov. 11, 2009

(65) Prior Publication Data

US 2010/0116333 A1    May 13, 2010

Related U.S. Application Data

(60) Provisional application No. 61/113,323, filed on Nov. 11, 2008.

(51) Int. Cl.
*C30B 23/00* (2006.01)

(52) U.S. Cl.
USPC .................. 117/94; 117/84; 117/87; 117/88; 117/90; 117/106; 117/951

(58) Field of Classification Search
USPC ..................... 117/84, 87, 88, 90, 94, 106, 951
See application file for complete search history.

(56) References Cited

U.S. PATENT DOCUMENTS

| | | | |
|---|---|---|---|
| 6,724,013 B2 | 4/2004 | Kneissl et al. | 257/79 |
| 7,255,844 B2 | 8/2007 | Ponce et al. | 423/409 |
| 2006/0019472 A1* | 1/2006 | Pan et al. | 438/486 |
| 2008/0025902 A1 | 1/2008 | Ponce et al. | 423/409 |

FOREIGN PATENT DOCUMENTS

WO    WO 2006/137651    12/2006

OTHER PUBLICATIONS

Han et al, "Controlled growth of gallium nitride single crystal nanowires using a chemical vapor deposition method," J. MAter. Res. vol. 18, No. 2, Feb. 2003, p. 245-249.*
Bedair et al., "A two-junction cascade solar-cell structure", Appl. Phys. Lett., 34, pp. 38-39, 1979.
Foutz et al., Transient electron transport in wurtzite GaN, InN and AlN, J. Appl. Phys., vol. 85, No. 11:7727-7734, Jun. 1, 1999.
Garcia et al., "A novel method for the synthesis of sub-microcrystalline wurtzite-type Inx Ga1-xN powders", Mat. Sci. Engineering, B, 90: pp. 7-12, 2002.
Garcia et al., "A Novel Method to Synthesize Blue-Luminescent Doped GaN Powders", Mat. Res. Soc. Symp. Proc., vol. 864:E6.10.1, 2005.
Garcia et al., "Growth of free-standing highly luminescent updoped and Mg-doped GaN thick films with a columnar structure", J. Crystal Growth, 310: pp. 3131-3134, 2008.
Garcia et al., "Light emission from GaN microcrystals", Proc., Int. Conf. on the Physics of Semiconductors (ICPS-27), AIP Conf. Proc. Q5.235-040248, 2005.
Garcia et al., "Structure and luminescence of nanocrystalline gallium nitride synthesized by a novel polymer pyrolysis route", Optical Materials, 20:19, 2006.

(Continued)

*Primary Examiner* — Matthew Song
(74) *Attorney, Agent, or Firm* — Fulbright & Jaworski L.L.P.

(57) ABSTRACT

Methods, devices, and compositions of matter related to high efficiency InGaN-based photovoltaic devices. The disclosed synthesis of semiconductor heterostructures may be exploited to produce higher efficiency, longer lasting, photovoltaic cells.

12 Claims, 10 Drawing Sheets

(56) References Cited

OTHER PUBLICATIONS

Garcia et al., "Synthesis of highly luminescent, undoped, Mg-doped and Si-doped GaN powders", J. Crystal Growth, 304, pp. 225-232, Jun. 2007.

Garcia et al., "Synthesis, Structure and Luminescence of High Brightness Gallium Nitride Powder", Mat. Res. Soc. Symp. Proc., vol. 798:Y10.75, pp. 1-6, 2004.

Green et al., "Solar Cell Efficiency Tables (Version 26)", Research and Applns., 13:387, 2005.

Hwang et al., "Growth of InGaN layer on GaN templated Al2O3 (0001) and Si (111) substrates by mixed-source HVPE", Phys. Stat. Sol. (c) 4, No. 1, pp. 125-128, 2007.

K. Scott et al., "Indium Nitride Emerges", Physics Dept., Macquarie University, Sydney NSW 2109, Australia, 1-3, Jul. 2002.

Karam et al., "Recent developments in high-efficiency Ga 0.5 IN0.5P/GaAs/Ge dual-and triple-junction solar cells: steps to next-generation PV cells", Solar Energy Mat. Solar Cells, 66:453, 2001.

Kaufmann et al., "Nature of the 2.8 eV photoluminescence band in Mg doped GaN", Appl. Phys. Lett., 72:1326, 1998.

Khan et al., "Performance of single-junction and dual-junction InGaP/GaAs solar cells under low concentration ratios", Appl. Phys. Lett., vol. 85, No. 15: pp. 3098-3100, 2004.

Kim et al., "Formation of InGaN nanorods with indium mole fractions by hydride vapor phase epitaxy", Phys. Stat. Sol. (b)241, No. 12, pp. 2802-2805, 2004.

Kuykendall et al., "Crystalline alignment of high-density gallium nitride nanowire arrays", Nature Materials, vol. 3: pp. 524-528, Aug. 2004.

Law et al., "Nanowire dye-sensitized solar cells", Nature Mat., 4: pp. 455-459, May 2005.

Monemar, "Bound excitons in GaN", Condens. Matterm 13: pp. 7011-7026, 2001.

O'Leary et al., "Electron transport in wurtzite indium nitride", J. Appln. Phys., 83:826-828, Jan. 15, 1998.

Ozden et al., "A Matrix Addressable 1024 Element Blue Light Emitting InGaN QW Diode Array", Phys. Stat. Sol., 188, No. 1, pp. 139-142, 2001.

Ponce et al., "Nitride-based semiconductors for blue and green light-emitting devices", Nature, vol. 386: pp. 351-359, Mar. 1997.

Red'kin et al.,"Chemical Vapor Deposition of GaN from Gallium and Ammonium Chloride", Inorganic Matererials, vol. 40: pp. 1197-1202, 2004.

S.D. Lester et al., "High dislocation densities in high efficiency GaN-based light emitting diodes" Appl. Phys. Lett., 66: pp. 1249-1251, Mar. 6, 1995.

T. Kuykendall et al., "Complete composition tunability of InGaN nanowires using a combinatorial approach", Nature Materials, vol. 6, pp. 951-956, Dec. 2007.

Takamoto et al., "InGaP/GaAs-based Multijunction Solar Cells", Prog. Photovolt: Research and Applns., 13: pp. 495-511, 2005.

Takeuchi et al., "GaN-Based Light Emitting Diodes with Tunnel Junctions", Jpn. J. Appl. Phys., vol. 40(2001), pp. L861-L863, Aug. 2001.

Tansley et al., "Electron Mobility in Indium Nitride", Electron Lett. vol. 20, No. 25/26, pp. 1066-1068, Dec. 6, 1984.

Van De Walle et al., "First-principles calculations for defects and impurities: Application to III-nitrides", J. Appl. Phys., vol. 95, No. 8: pp. 3851-3879, Apr. 2004.

Van De Walle et al., "Theory of doping and defects in III-V nitrides", J. Crystal Growth, 189/190: pp. 505-510, 1998.

Wagner et al., "Vapor-Liquid-Solid Mechanism of Single Crystal Growth", Appl. Phys. Lett., vol. 4, No. 5: pp. 89-90, Mar. 1964.

Woodall et al., "High-efficieny Ga1-xAlx As—GaAs solar cells", Appl. Phys. Lett., vol. 21, No. 8: pp. 379-381, Jul. 1972.

Wu et al., "Superior radiation resistance of In1-xGaxN alloys: Full-solar-spectrum photovoltaic material system", J. Appl. Phys., vol. 94, No. 10: pp. 6477-6482, Nov. 15, 2003.

Yamaguchi et al., "Multi-junction III-V solar cells: current status and future potential", Solar Energy, 79: pp. 78-85, 2005.

Zimmler et al., "Electroluminescence from single nanowires by tunnel injection: an experimental study", Nanotechnology, 18:235205, 2007.

\* cited by examiner

Nitride semiconductors cover the widest range of the electromagnetic spectrum.

The InGaN alloy system covers the full solar spectrum.

3-D InGaN solar cells nano-columns of about 0.1 microns. Taper is a natural effect of p-type doping.
Layer thickness is designed to assure constant current through device.

FIG. 14

INGAN COLUMNAR NANO-HETEROSTRUCTURES FOR SOLAR CELLS

RELATED APPLICATIONS

This application claims benefit to U.S. Provisional Application No. 61/113,323, filed Nov. 11, 2008, which is incorporated by reference in its entirety.

BACKGROUND

1. Field of the Invention

The present invention generally relates to growth of InGaN-based structures. More particularly, but not by way of limitation, the present invention relates to the growth of high-quality InGaN-based heterostructures that can be suitable for use in high-efficiency optoelectronic devices such as, for example, photovoltaic cells.

2. Description of Related Art

Figure 1:
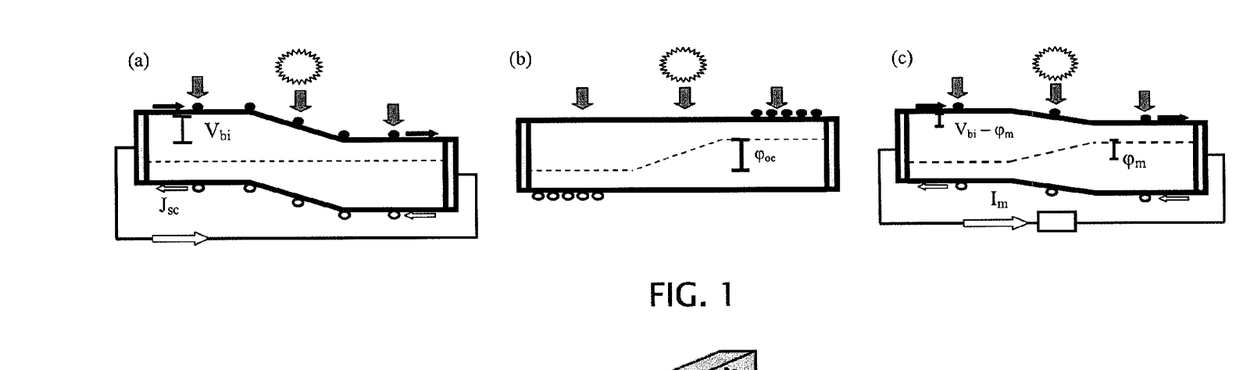
FIG. 1: Homojunction solar cell under (a) short circuit, (b) open circuit and (c) operating conditions

Worldwide energy demand is growing at high speed with the rapid economic development of many nations. As one of the forefront technologies for clean, renewable energy, there is much demand for new solar cell technologies. The use of photovoltaic devices that can absorb and convert light into electrical power has been limited by conversion efficiencies and high production costs. Even the fabrication of the simplest semiconductor cell is a complex process that has to take place under exactly controlled conditions, such as high vacuum and temperatures between 400 and 1,400 degrees Celsius. Current silicon based solar cells are inefficient and relatively expensive. GaAs-based solar cells for use in concentrator and space systems can be highly efficient, yet more expensive. The progression of efficiency of III-V solar cells has been more recent than for silicon, and is best illustrated by starting with a basic p-n junction device and adding materials layers and discussion as needed. A band diagram schematic of a basic p-n junction device is given in FIG. 1. As a simple p-n doped homojunction device, GaAs is hampered by a high absorption coefficient. High absorption within a diffusion length of the surface leads to large surface recombination losses and devices had low efficiencies (~10%) [2].

A breakthrough in the early 1970's led to the formation of a heteroface or buried homojunction device with a high bandgap AlGaAs "window" at the incident light surface. The bandgap of AlAs is 2.15 eV and for GaAs is 1.43 eV, with alloy bandgap energies ranging between the two. Light incident on such a device will first encounter the high bandgap window where high energy photons will be absorbed and mostly lost due to surface recombination. However, many of the photons will be transmitted further into the device and absorbed away from the surface. Devices utilizing this window had greatly improved efficiency (16%, AM1, sea level), indicating that the effective diffusion length of carriers, considering both the bulk and surface recombination, is greater with the window material [28].

Figure 2:
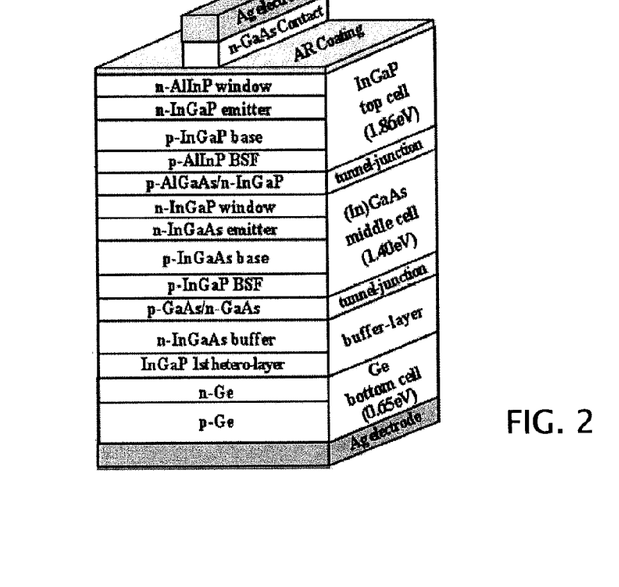
FIG. 2: Recent high-efficiency triple junction solar cell [9].

Interface defects are one problem that occurs with the window approach due to lattice mismatch between the AlGaAs window and GaAs cell. The lattice parameters of GaAs and AlAs are 5.653 Å and 5.660 Å respectively, leading to a lattice mismatch of only ~0.15%. Even though alloy mismatch is very small, interface states are formed and lead to recombination loss. More-recent cells have improved on this problem by using different III-V materials [11, 21, 30]. The switch of materials is also partly due to the problem of oxygen related defects present in AlGaAs [30]. FIG. 2 shows one example of a recent triple junction solar cell. While recent cells are extremely complicated, they continue to use the same window principle to reduce recombination losses. In this case, the top cell uses a lattice matched AlInP window to the InGaP junction, the middle cell uses an InGaP window to the InGaAs junction and the bottom cell uses an InGaAs buffer layer to help lattice match to the Ge junction/substrate [30]. Other materials possibilities are also utilized in other cells. Efficiency increases by use of a large bandgap "window" material to force absorption away from the surface, and by ensuring good lattice matching at all interfaces to avoid interface states or other recombination defects.

As discussed above, buried homojunction devices utilizing an AlGaAs window and single GaAs junction were first explored. Because GaAs has a direct bandgap of 1.43 eV, devices composed of GaAs are operable at relatively high temperatures. The temperature at which a device becomes inoperable generally depends on the material bandgap, doping and the temperature. At high temperatures the intrinsic carrier concentration becomes equal to the doping level and "kills" the device. GaAs cells often work well in concentrator systems where heat is a natural product of the solar concentration. However, as was shown for the case of a general silicon cell, the efficiency of a single material solar cell may be inherently limited. Single homojunction GaAs cells generally have maximum achievable efficiencies under concentration of ~27-30% [2]. Because of this inherent material limitation, recent work has involved increasing efficiency by forming multi junction cells with two, three and even four junctions [11, 13, 21, 30].

FIG. 2 shows a recent high efficiency triple junction cell (33.3% efficiency, no concentration) [30]. For a given semiconductor, photons with energy below the bandgap are transmitted and lost. Similarly, high energy photons are absorbed, but the energy in excess of the bandgap is lost as carriers thermalize to the band edge. The highest efficiencies are achieved when the photon energy is closely matched to the bandgap. Multi junction devices use a larger bandgap junction at the surface to absorb high energy photons while transmitting lower energy photons to the next cell with smaller bandgap. Although some of the light may be lost as more junctions are added, this approach leads to record high efficiencies. The current efficiency record is 37.9%±2.3% and is held by a triple-junction GaInP/GaAs/GaInAs 2-terminal solar cell under 10 times concentration [10]. The efficiency of the device in FIG. 2 could be increased further by increasing the bandgap of the top cell from 1.86 eV to 1.96 eV by using AlInGaP [30]. Recent III-V devices are highly complex and sensitive to modifications—slight modifications to material parameters, compositions or even cell design can drastically affect cell performance.

Also related to the number of junctions, a recent advance involved the use of Ge as the substrate in place of GaAs, which conveniently also acts as an additional solar junction. Ge is an indirect bandgap semiconductor with a gap of 0.65 eV and a lattice parameter very close to GaAs and other common III-V alloys. Due to the small bandgap, cells utilizing a Ge substrate are no longer appropriate for high temperature operation. As a substrate, Ge is generally less expensive and tougher than GaAs, and, with proper doping, has the benefit of adding an extra working junction. Despite obvious benefits, the small lattice mismatch between Ge and GaAs of only 0.08% is enough to form interface misfit dislocations with a telltale crosshatch pattern. Because Ge acts as the substrate, it was necessary to modify the lattice parameters of all of the subsequent layers. The misfit dislocations were greatly decreased, and cell performance increased, by the introduction of about 1% indium into the InGaP and GaAs junction layers [30]. This example illustrates that lattice matching is critical to reduce defects and increase efficiency.

Another breakthrough that occurred in the 1970's was the use of highly doped tunnel junctions between each cell of a multijunction device. This technology has been refined, and is used in all high-efficiency multijunction cells today. The first tunnel junctions used in solar cells were generally thin, highly doped p-n junctions. The tunnel junction improves the efficiency of the device and should have low impedance to current flow, small potential drop across the junction and should transmit all of the light to the next cell in line [1]. Efficiency can be improved by reducing the tunnel junction thickness for less absorption and by making the bandgap larger than the surrounding cell so that more light is transmitted [11]. Recent tunnel junctions utilize double hetero-structures of p-AlInGaP/p-AlGaAs/n-(Al)InGaP/n-AlInGaP to increase the incident light onto the middle cell and to also produce potential barriers for minority carriers in the top and middle cell [3, 4]. Properly designed and implemented tunnel junctions lead to larger $J_{sc}$ and $\phi_{oc}$ and greater efficiencies. Examples of nitride based tunnel junctions structures can be found in [17], [22], and [24]

SUMMARY

Embodiments of the present invention are suitable for growing high-quality heterostructures (e.g., InGaN-based heterostructures) to enable the fabrication of high-efficiency photovoltaic devices. The present discovery and understanding of inexpensive (e.g., less expensive than previous methods) methods for growing high quality nano- and microcolumns (e.g., InGaN nano- and/or micro-columns) facilitates the fabrication of high-efficiency optoelectronic devices, such as, for example, solar cells. A high-growth-rate chemical vapor deposition technique with gallium-indium (and/or other) metallic alloys and ammonium chloride may be used as source materials and ultra-high purity ammonia and hydrazide as carrier gas and nitriding agent, respectively, in a three-zone horizontal quartz tube reactor. The present advances in the synthesis of semiconductor heterostructures may be exploited to produce higher efficiency, longer lasting, photovoltaic cells.

Embodiments of the present methods for growing GaN (and/or other) nanocolumns comprise: depositing a gold layer on a silica substrate; annealing the gold layer to form regions configured to act as catalyst and nucleation sites for GaN (and/or other metal or and/or metallic alloy) growth; and performing a Ga—Mg (and/or other) alloy deposition process that is configured to form p-type GaN (and/or other) columns on the gold layer. In some embodiments, performing the alloy (e.g., Ga—Mg alloy) deposition process comprises: flushing a collection of the deposited gold layer, alloy (e.g., Ga—Mg alloy), and ammonium chloride salt with nitrogen in a vacuum environment; exposing the collection to temperature of about 900° C.; and introducing a flow of ammonia to the collection. In some embodiments, the collection is exposed to a temperature of 900° C. and to the flow of ammonia until at least a portion of the p-type columns (e.g., GaN columns) coalesce into a continuous layer. In some embodiments, the at least a portion of the p-type columns (e.g., GaN columns) coalesce into a continuous layer having a thickness greater than about 15 μm (e.g., equal to or greater than about 25 μm). In some embodiments, the alloy (e.g., Ga—Mg alloy) deposition process further comprises decomposing $NH_4Cl$ to release ammonia. In some embodiments, decomposing $NH_4Cl$ is continued until the $NH_4Cl$ is depleted.

Some embodiments of the present methods further comprise: exposing the substrate to a temperature lower than 900° C.; where exposing the substrate is performed after at least a portion of the columns have coalesced into a continuous layer.

Some embodiments of the present methods further comprise: introducing a flow of $N_2$ to the substrate. In some embodiments, the flow of $N_2$ is continued until the columns have cooled to ambient temperature.

Some embodiments of the present methods further comprise: removing the film layer from the substrate using ultrasonication with a washing fluid comprising hydrofluoric acid.

Some embodiments of the present methods further comprise: depositing a second gold layer on a second silica substrate; annealing the second gold layer to form regions configured to act as catalyst and nucleation sites for InN growth; performing an In deposition process that is configured to form n-type InN columns on the second gold layer. In some embodiments, performing the In deposition process comprises: flushing a collection of the deposited gold layer, In, and ammonium chloride salt with nitrogen in a vacuum environment; exposing the collection to temperature of about 900° C.; and introducing a flow of ammonia to the collection.

Some embodiments of the present methods for growing GaN and InN nanocolumns comprise: providing a first silica substrate having a gold layer with annealed regions configured to act as catalyst and nucleation sites for GaN growth; providing a second silica substrate having a gold layer with annealed regions configured to act as catalyst and nucleation sites for InN growth; performing a Ga—Mg alloy-deposition and InN-deposition process that is configured to form p-type GaN columns on the gold layer of the first silica substrate and to form n-type InN columns on the gold layer of the second silica substrate.

In some embodiments, performing the Ga—Mg alloy-deposition and InN-deposition process comprises: flushing a collection of the deposited gold layers of the first and second silica substrates, Ga—Mg alloy, InN, and ammonium chloride salt with nitrogen in a vacuum environment; exposing the collection to temperature of about 900° C.; and introducing a flow of ammonia to the collection. In some embodiments, the collection is exposed to a temperature of 900° C. and to the flow of ammonia until at least a portion of the p-type GaN columns coalesce into a continuous layer and at least a portion of the n-type InN columns coalesce into a continuous layer. In some embodiments, the portion of the p-type GaN columns coalesce into a continuous layer having a thickness greater than about 15 μm (e.g., equal to or greater than about 25 μm), and the portion of the n-type InN columns coalesce into a continuous layer having a thickness greater than about 15 μm (e.g., equal to or greater than about 25 μm).

Embodiments of the present solar cells may include a GaN film and an InN film. In some embodiments, the solar cell may be configured to be used such that the GaN faces incident light. In some embodiments, the InN film may be produced without doping.

BRIEF DESCRIPTION OF THE FIGURES

The following drawings form part of the present specification and are included to further demonstrate certain aspects of the present invention. The invention may be better understood by reference to one or more of these drawings in combination with the detailed description of specific embodiments presented herein.

DESCRIPTION OF ILLUSTRATIVE EMBODIMENTS

As the efficiency of III-V solar cells has dramatically increased over the last several decades due to design breakthroughs and better materials growth, the complexity and cost have also increased proportionally. Even though cells for space and concentrator applications are not so sensitive to cost, low-cost highly-efficient cells are still the ideal for worldwide implementation. To achieve this ideal, manufacturing costs must be reduced further, or new materials developed for low cost, efficient cells.

The main benefit to using III-V solar cells is their high achievable efficiencies. However, manufacturing complexity and resultant cost are the main problems. Embodiments of the present disclosure present a new III-V materials system that may address the manufacturing complexity and cost issue. Disclosed are a new III-V materials system, unexplored until very recently—alloys of InGaN.

Figure 3:
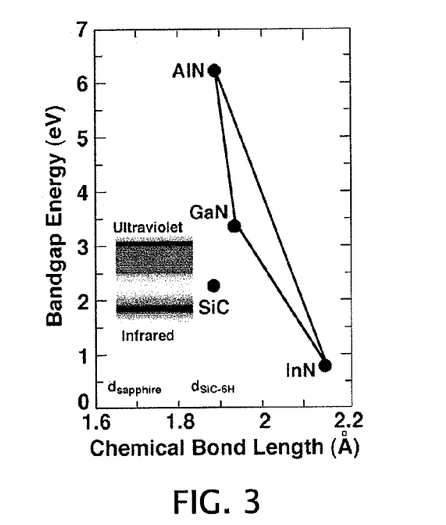
FIG. 3: Bandgap versus bond length for the InGaN system [9].

FIG. 3 shows the band gap energy as a function of the chemical bond length for the InGaN alloy system. Recently, the band gap of InN has been revised to around 0.7 eV due to better materials growth [29]. This shows that the band gap of InGaN alloys span a large portion of the solar spectrum.

InGaN System

Figure 4:
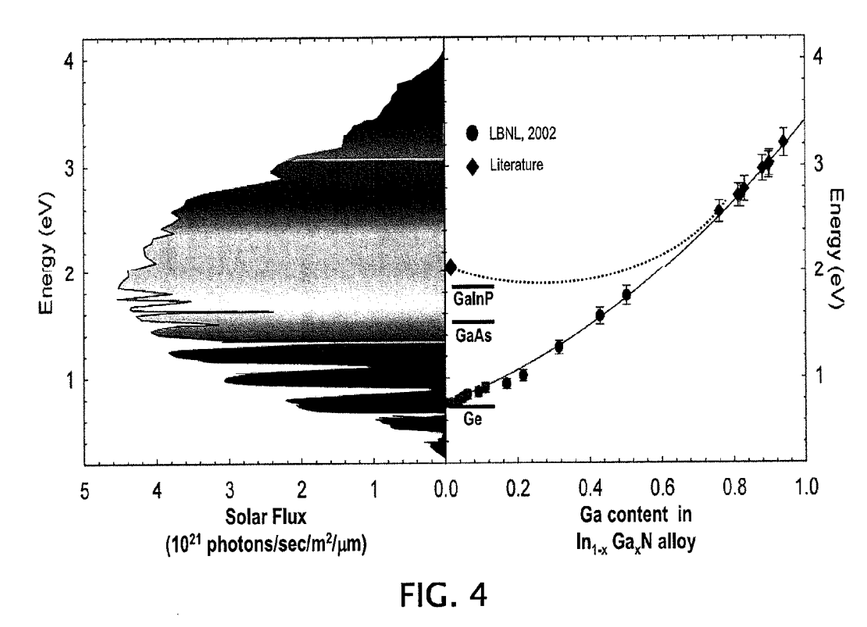
FIG. 4: Solar spectrum versus bandgap for the InGaN alloy system [20].

FIG. 4 shows the variation of the band gap of InGaN alloys with composition and its relationship to the solar emission spectrum. However, the InGaN system is significantly different from other III-V materials. These differences appear to be advantageous for solar cell use.

Crystal structure—InGaN alloys generally have the hexagonal wurtzite structure. Other III-V solar cell systems are cubic.

Defects and dislocations—The a-lattice constant of GaN is 3.189 Å and for InN is 3.548 Å leading to a huge lattice mismatch of 11.3%. As a result, depending on the indium composition, large strains will develop with the growth of InGaN. Typically, strain is reduced by the formation of defects including threading, edge or misfit dislocations as well as stacking faults and point defects. In conventional silicon or III-V semiconductors, high defect levels lead to early failure. Strangely, defects in the InGaN system do not seem to adversely affect performance or device lifetimes of LEDs. Blue LEDs manufactured from InGaN alloys have very long projected lifetimes [18]. If InGaN solar cells behave like LEDs, high defect densities may have a negligible effect on device efficiency.

Strain and piezoelectricity—InGaN alloys have a spontaneous polarization and are also piezoelectric. When strained, the piezoelectric field may favorably add to the built in potential under certain situations. Thus, very high $\phi_{oc}$ potentials may result if devices are designed properly.

Doping—Doping is important for the development of p-n junctions. As-grown materials are inherently n-type [29]. Achieving p-type conductivity requires additional efforts (e.g., doping), as discussed below.

Minority carrier diffusion length and fields—The high defect densities may adversely affect the minority carrier diffusion lengths and carrier lifetimes. Devices will necessarily need to be thin to minimize the distance carriers must travel before collection. The ery high piezoelectric fields can be beneficial to the collection of carriers.

Manufacturing—Depending on the design of the cell, complexity and manufacturing can be quite simple, as in the present methods described in more detail below. The present methods can also be scaled and/or expanded for production on a larger scale.

Solar concentration—Like other efficient III-V solar cells, the cost of the material may be somewhat high. Thus, solar concentration may be a perfect application for InGaN solar cells.

Synthesis of Alloys Such as GaN and InN

Figure 5:
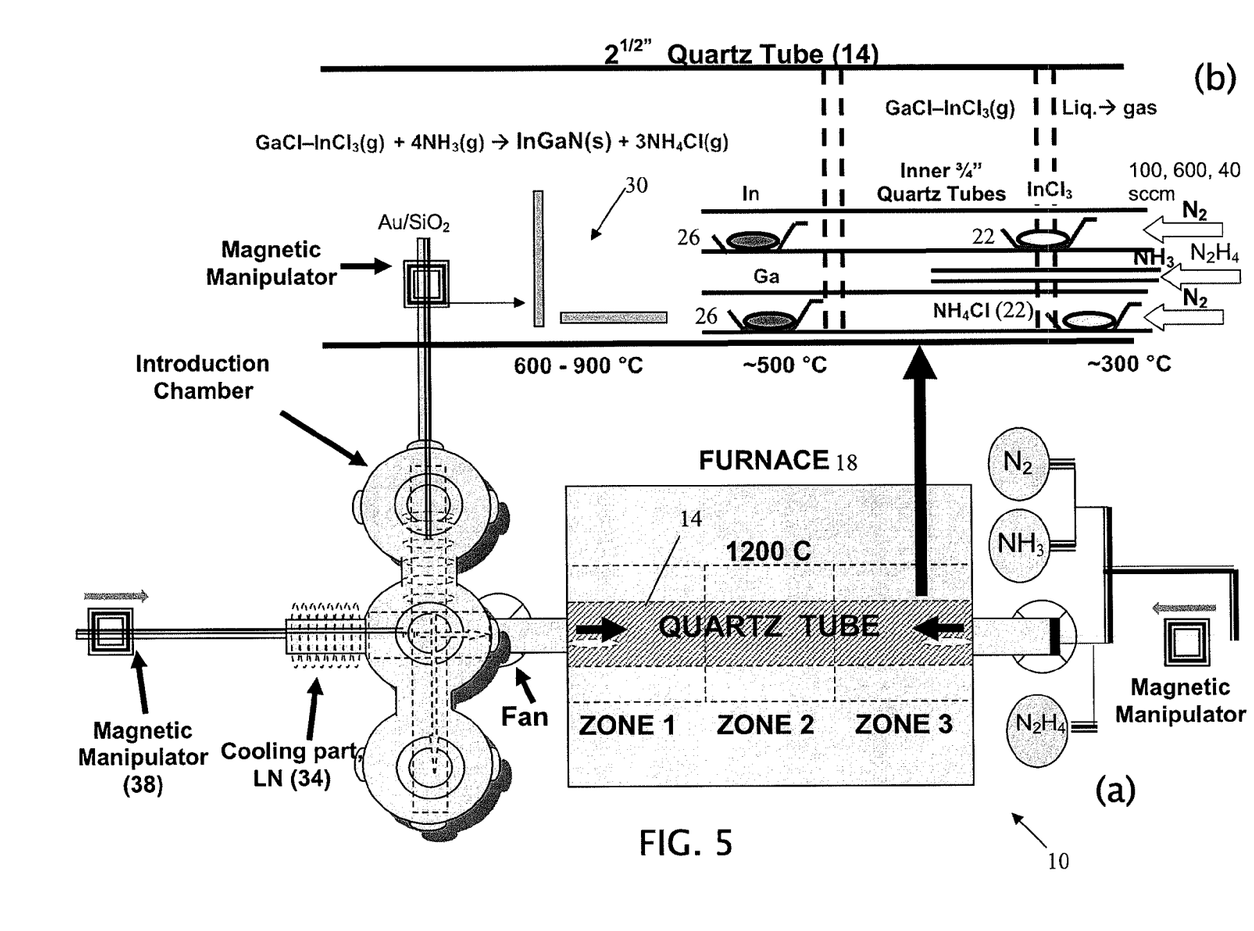
FIG. 5: Schematic of (a) three-zone horizontal quartz tube reactor used in the growth of AlN, GaN, InN, InGaN and AlGaN; and (b) inset of enlarged view of quartz tube.

High-quality un-doped and doped GaN and InN nano- and micro-columns have been grown on gold covered fused silica substrates by chemical vapor deposition (CVD) using Ga, Ga—Mg and In, respectively, as starting material with ammonium chloride as reactant and using ammonia as a carrier gas and hydrazine as low temperature nitriding agent in a three-zone horizontal quartz tube reactor 10.

The present disclosure generally describes synthesis of GaN and/or InN alloys. However, in other embodiments, the present systems and methods can include synthesis and/or doping of other alloys and/or growth of nano- and/or micro-columns comprising other alloys. U.S. patent Ser. No. 10/589,541, filed May 1, 2007, is incorporated here in its entirety, and may include certain details regarding other metals, alloys, and/or dopants that can be used in and/or made by the present methods.

The schematic set up for the CVD reactor 10 is shown in FIG. 5. Reactor 10 comprises a 2.5-inch diameter quartz tube 14 heated in a horizontal furnace 18. In other embodiments, quartz tube 14 can have any suitable diameter, such as, for example, 1.5 inches. Five boats containing reactants and substrate are located inside quartz tube 14, as shown. In other embodiments, any suitable number of boats can be used (e.g., two, three, four, six, or more). Two boats 22 with the chloride salt (e.g., $NH_4Cl$, $InCl_3$, and/or the like) are located at the entrance of tube 14. Two boats 26 containing the metal source (In, Ga, or Ga—Mg alloy; and/or, in other embodiments, In—Mg alloy, In—Si alloy, Ga—Si alloy, Ga—Zn alloy, Ga—Ge alloy, In—Zn alloy, and/or the like) are located in ZONE 1 of tube 14. And one boat 30 that holds one or more substrates (gold covered fused silica disk, shown enlarged for reference) is disposed in ZONE 2 of tube 14. In other embodiments, multiple boats 30 can be used (e.g., each with one or more substrates). The following reactions take place, in agreement with a method that may be partially similar to that used by Red'kin et al. to grow pure GaN on fused silica [20]:

Entrance: $NH_4Cl_{(s)} \leftrightarrow NH_{3(g)} + HCl_{(g)}$

Zone 1: $In/Ga/Ga-Mg_{(l)} + HCl_{(g)} \rightarrow InCl/GaCl/Mg-GaCl_{(g)} + \frac{1}{2}H_{2(g)}$ Zone 2: $InCl/GaCl/Mg-GaCl_{(g)} + N_2H_4 + 2NH_{3(g)} \rightarrow InN/GaN/GaN:Mg_{(s)} + NH_4Cl_{(g)} + 3H_{2(g)} + N_{2(g)}$ Exit: $NH_4Cl_{(g)} + 3H_{2(g)} + N_{2(g)} \rightarrow NH_4Cl_{(s)} + 3H_{2(g)} + N_{2(g)}$ In the present embodiment, gold layer (~10 nm) was deposited on a 1-inch diameter fused silica substrate by sputtering, with a following thermal treatment substantially at or about 900° C. This anneal made the gold film disperse forming ~50 nm size islands that act as catalysts and nucleation sites for GaN and InN growth. In other embodiments, the gold layer can act and/or be configured to act as catalysts and nucleation sites for any of the alloys mentioned above.

In the present embodiment, the Ga—Mg alloy (0.1 at. % Mg) was prepared at 600° C., using a mechanical shaker, in a manner previously described [4]. Mg is soluble in Ga and can form liquid solutions in all proportions at temperatures greater than 100° C., in agreement with the binary alloy phase diagram [15].

In the present embodiment, the deposition processed can be undertaken and/or can comprise the steps described as follows. Once boat 30 containing the substrate (gold-covered silica), boats 26 containing metal (~10 g), and boats 22 containing ammonium chloride salt (~5 g) are placed inside quartz tube 14, the tube is flushed with nitrogen while evacuated with a mechanical pump down to $10^{-2}$ Torr. The temperature is increased, and when the central zone the tube reaches 900° C., the nitrogen flushing and evacuation are stopped, and a flow of ammonia is started (~350 sccm, 730 Torr). At that point the temperature at the entrance of the reactor is ~300° C., such that the salt begins to evaporate. The salt vapor is carried through quartz tube 14 by nitrogen. When the vapor reaches zone 1, at ~500° C., it decomposes into hydrochloric acid (HCl) and ammonia. The HCl reacts with the metal forming a volatile chloride compound that is carried towards the substrate. The gallium chloride and the ammonia or hydrazine react on the surface of the substrate yielding InN, GaN or GaN:Mg that grows as hexagonal columns influenced by the presence of the gold droplets, in what appears to be the solid-liquid-vapor mechanism [27]. These columns coalesce as growth progresses to form a continuous thick layer of InN, GaN, or GaN:Mg. The growth reaches completion after around one hour when the $NH_4Cl$ has been consumed. The boat with the substrate and the deposit (InN, GaN or GaN:Mg) is moved rapidly to the coldest part (e.g., cooling part 34) of reactor 10 using a magnetic manipulator 38. The ammonia and hydrazine flows are then replaced by $N_2$ flow. After the system is cooled down to room temperature, boat 30 is taken out of reactor 10. The InN, GaN and GaN:Mg films are easily removed from the substrate (fused silica) by ultra-sonication using hydrofluoric acid (35%) as washing fluid.

Figure 6:
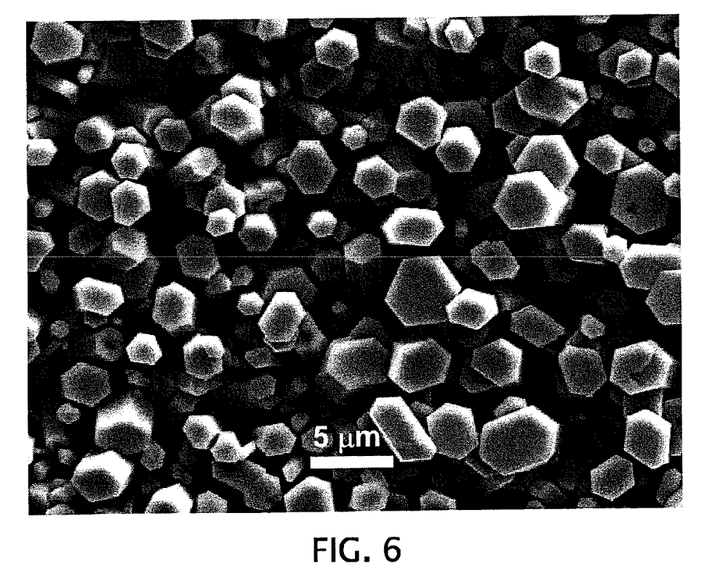
FIG. 6: SEM images of GaN:Mg nano- and micro-columns grown on gold droplets by CVD.
Figure 8:
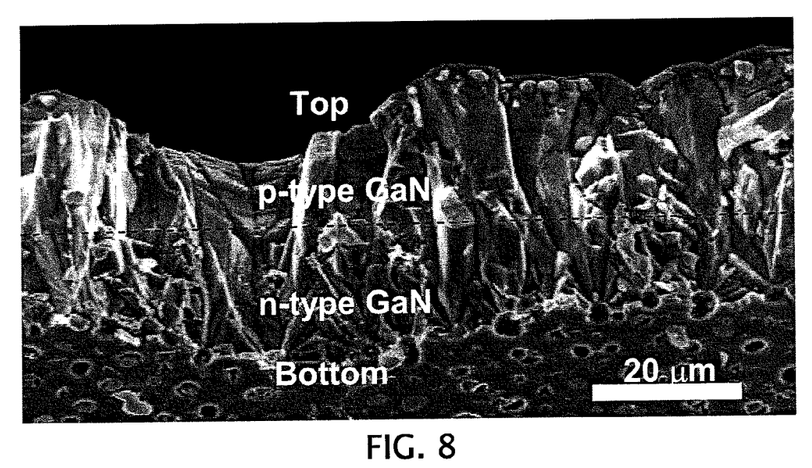
FIG. 8: Cleaved cross section of a free-standing GaN p-n junction film (~45 μm thick). After ~10 μm of growth, the columns coalesce and form continuous films

A scanning electron microscope image of the Mg-doped GaN thick film grown in this work is shown in FIG. 6. The initial stage of the deposit (between 1-20 min) presents a columnar growth, as shown. These columns exhibit hexagonal-flat facets, with diameters between 200 nm and 5 μm, and an average height between 5 and 10 μm. After that point the columns coalescence and self-organize to develop a high-density thick film as shown in FIG. 8. X-ray diffraction analysis indicates that the GaN:Mg columns grow in the c-direction.

Figure 7:
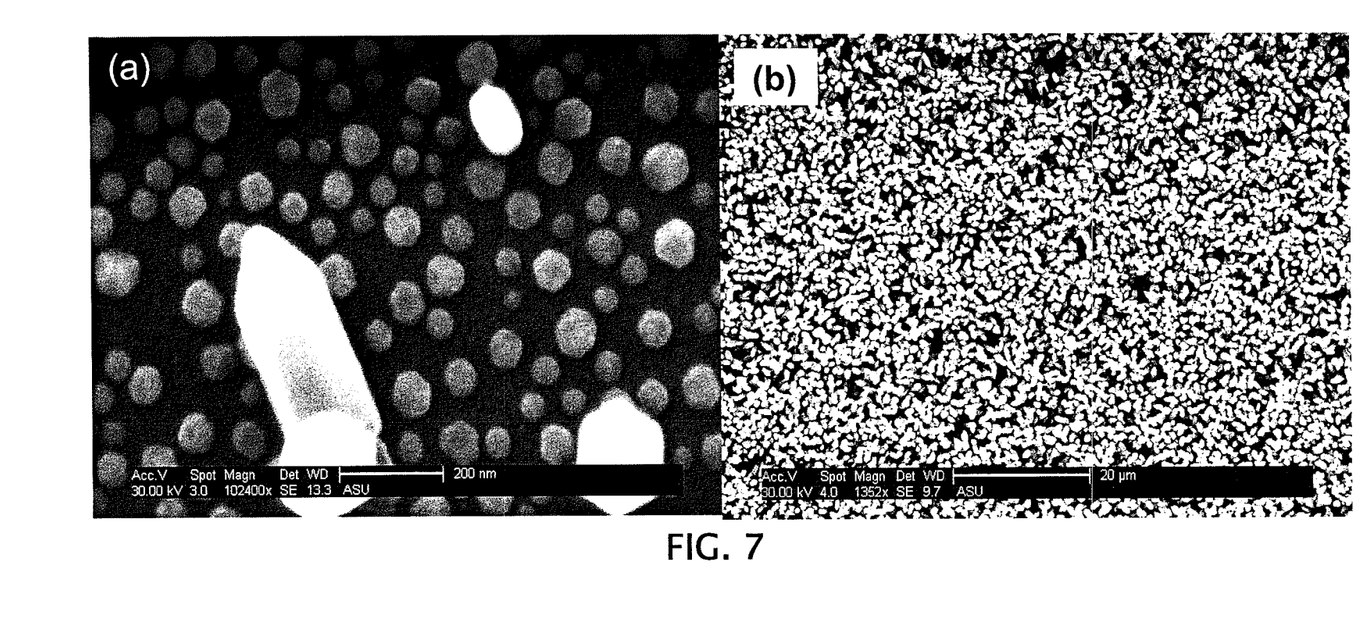
FIG. 7: SEM images of InN nano- and micro-columns grown on gold droplets by CVD: (a) after ~5 min. growth, and (b) after ~50 min. growth.

On the other hand, the InN columns showed a more uniform diameter distribution and a pointed ends as it can see in the SEM image presented in FIG. 7. The hexagonal columns shown are about 5 μm long with diameters between 1 and 2 μm. They show a wurtzite structure with {1-100}, (11-22) and {0001} crystalline facets.

Figure 9:
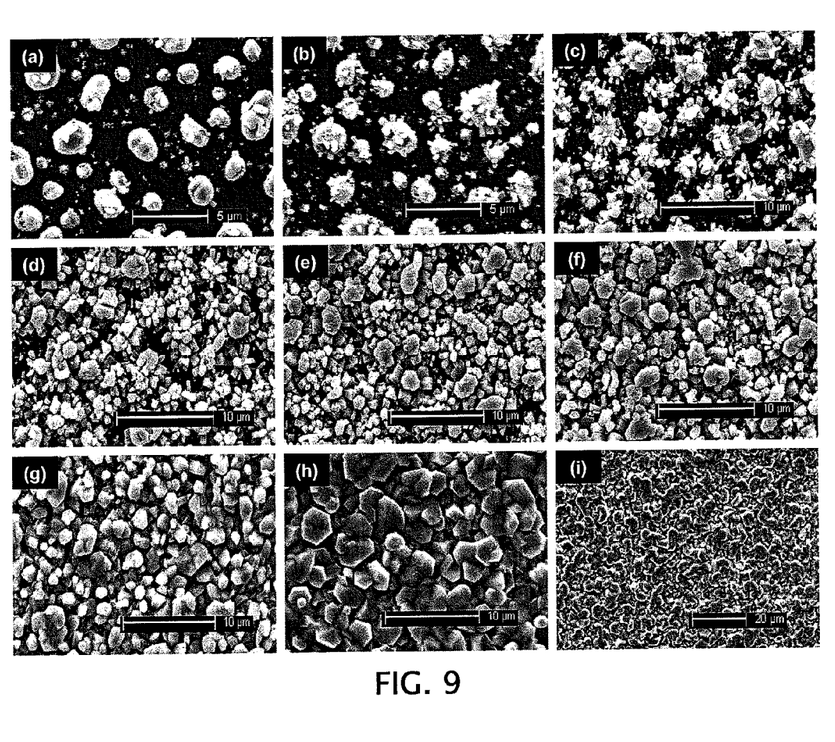
FIG. 9: Sequential secondary electron images of the GaN growth process. The images in (a-c) show the early (<10 min.) stages of the deposition. The gradual coverage of the islands are observed in images (d-f). The formation of a continuous film is observed in (g-i).

A chronological evolution of the GaN growth morphology is shown in FIG. 9. These secondary electron images were taken at intervals of ~5 minutes It can be observed that the GaN columns grow on the gold islands (see FIG. 9(*a-c*)), and that the number of columns increases until they cover completely the islands (see FIG. 9(*d-f*)), to finally generate a continuous polycrystalline film (FIG. 9 (*g-i*)).

Figure 10:
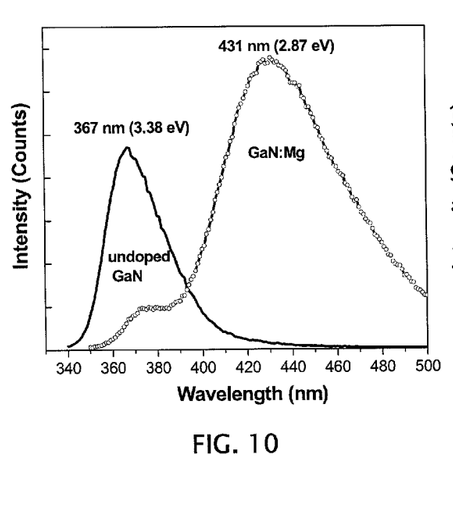
FIG. 10: Room temperature CL spectra of the un-doped and Mg-doped GaN thick film grown by CVD.

Room-temperature cathodoluminesce spectra of the undoped and Mg-doped GaN columns grown in this work are shown in FIG. 10. A characteristic broad and strong near band-edge emission centered at 367 nm (3.378 eV) is observed in the undoped GaN. On the other hand, the blue luminescence (BL), a broad peak centered at 431 nm (2.87 eV) is the dominant emission in the Mg-doped sample. That emission is characteristic in the heavily doped GaN due to a deep donor acceptor pair (DDAP) related to a Mg-complex in a deep acceptor level [12, 25]. The near-band-to-band emission (~370 nm) is also visible in this GaN:Mg spectrum but it is six times less intense than the BL. Yellow luminescence was not observed in the columns grown by this CVD method.

Figure 11:
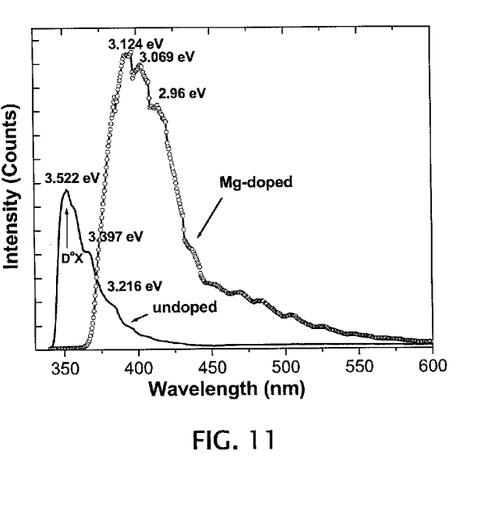
FIG. 11: 10 K temperature PL spectra of the un-doped and Mg-doped GaN columns grown by CVD.

FIG. 11 shows the 10 K temperature photoluminescence (PL) spectra of the un-doped and Mg-doped GaN columns grown in the present work. The peak at 3.52 eV, in the un-doped sample, is the donor bound exciton (D° X) typically observed in high quality GaN thin films [16]. The peak around 3.4 eV has previously been attributed to Mg as donor and oxygen contamination [26]. Also observed in the spectrum is a donor acceptor pair (DAP) emission at 3.246 eV. The Mg-doped sample does not show the D° X being the DAP (~3.25 eV) and its related phonon replicas (3.163, 3.077 and 2.995 eV) the dominant emissions as it is common in the heavily Mg-doped GaN [16]. It is also possible to observe in this spectrum the blue luminescence (BL) (broad peak between 450 and 500 nm) related to Mg complex as deep donor [12]. In both cathodoluminescence (CL) and PL analyses (FIGS. 10 and 11), it is possible to observe that the luminescence intensity of the GaN:Mg is superior to the luminescence of the un-doped or un-intentional doped GaN. Therefore Mg as dopant improves luminescence of GaN as phosphor.

The optoelectronic properties of these hexagonal nanocolumns are comparable to the GaN thin films grown epitaxially with other techniques such as metal-organic vapor deposition (MOCVD) and molecular beam epitaxial (MBE). This growth method can be used as an inexpensive technique, to manufacture optoelectronic devices such as light emitter diodes, laser diodes and for photovoltaic cells.

In summary, this novel technique grows high quality InN and GaN nano- and micro-columns (and resultant coalesced layers) by chemical vapor deposition on gold droplets deposited on fused silica substrates. Photoluminescence and cathodoluminescence studies at low temperature show that the dominant emission is the Mg-related donor-acceptor-pair band, which provides clear evidence that magnesium is incorporated into the GaN columns as an acceptor. These films are highly luminescent with efficiency comparable to those previously seen in thin films grown by more expensive techniques such as metal-organic chemical vapor deposition and molecular beam epitaxy which would suggest that the material is a good candidate for electroluminescent devices and photovoltaic applications.

Reference [31] may provide additional details related to the growth of free-standing highly luminescent undoped and Mg-doped GaN thick films with a columnar structure, and is incorporated here by reference in its entirety.

InGaN Properties and Applications

The InGaN system has a few special properties that make it applicable for photovoltaic applications, namely; an alloy bandgap that ranges throughout the visible spectrum and internal piezoelectric fields that may help to separate carriers and lead to devices of higher efficiency. A device structure is presented, along with an analysis of likely problems and the research tools that will help solve them.

Figure 12:
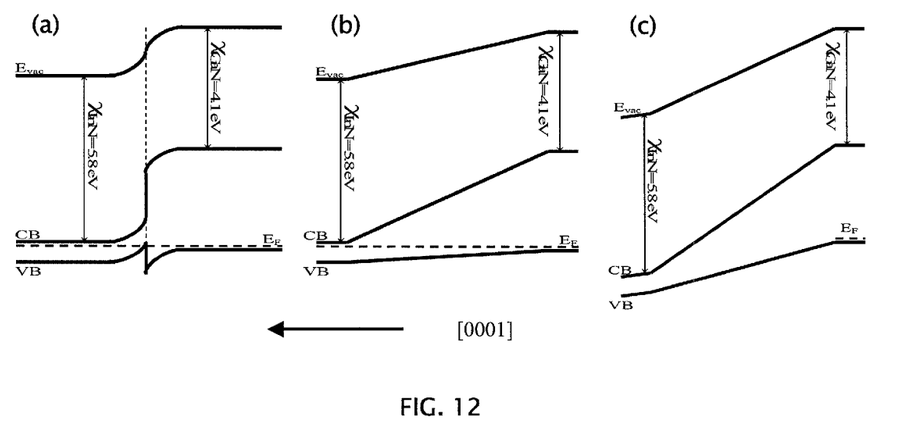
FIG. 12: Schematic band diagrams of (a) InN—GaN heterojunction without strain, (b) graded InGaN junction without strain and (c) graded InGaN junction with estimated effect of strain.

FIG. 12 shows schematic band diagrams of InGaN devices; an abrupt InN—GaN heterojunction without strain (FIG. 12(a)), a graded InGaN junction without strain (FIG. 12(b)) and a graded InGaN junction with estimated strain effects (FIG. 12(c)). Alloys of InGaN span a large portion of the solar spectrum. As has been shown for other III-V materials, one method to improve cell efficiency is to increase the number of junctions. However, the lattice mismatch between GaN and InN is so large, multijunction cells composed of several p-n junctions of different indium composition InGaN alloys would have a high concentration of defects and recombination at the interfaces.

FIG. 12(a) illustrates that a 2-D hole gas would be formed at the heterojunction between InN and GaN. Experience working with various indium composition InGaN quantum wells grown on GaN hints that direct growth of InN on GaN may be impossible, leading to InN film breakdown. Other III-V systems achieve high efficiency only by avoiding interface defects through precise lattice matching. Due to this limitation, it may be advantageous from both a manufacturing, cost, and efficiency perspective to produce a graded bandgap InGaN solar cell. InGaN growth would begin with a thin, unstrained GaN substrate. At first p-type GaN would be grown, followed by a steady increase in the concentration of indium and ending with InN. Growth would proceed in the [0001] or +c direction. All InN films to date are highly n-type, and would require no doping [29]. FIG. 12(b) illustrates the expected band diagram for a graded bandgap device without strain. Due to the continuous change in composition, it is expected that the electron affinity can be linearly interpolated between GaN and InN. Such a device would be utilized with the GaN face to the incident light. Like other III-V devices with high absorption coefficients, a graded InGaN cell would benefit from a large bandgap (GaN $E_G$=3.39 eV) "window" to force the majority of absorption away from the surface. A real device would also have to account for the compressive strain developed as growth proceeds. As indium composition is progressively increased, the film will become more compressively strained. Compressive strain leads to a positive polarization field along the [0001] direction and to a negative piezoelectric field. The effect of this piezoelectric field should be to increase the band bending and obtain better carrier separation as shown in (FIG. 12(c)).

Considerations for Device Design

A number of considerations and characteristics may be considered for designing embodiments of the present devices. Various methods can also be used to verify functionality of the present devices, and/or to make design adjustments in the present devices. Several of such considerations include:

Materials growth—Materials growth is the primary consideration. As discussed above, the present methods include CVD. Other embodiments can include MOCVD. Indium composition can be smoothly adjusted by increasing the ratio of indium to gallium compounds, while slowly decreasing the temperature of the substrate.

Cathodoluminescence (CL)—CL measures recombination light output. Cross-section CL can be used to measure variations in the bandgap. For example, a complete CL line scan from the GaN to InN side of a device can help confirm that (e.g., determine whether) indium is incorporating properly and that emission varies from GaN to InN.

Energy dispersive spectroscopy (EDS)—EDS can be performed at the same time as the CL measurements to determine the composition of the alloy across the device.

Transmission electron microscopy (TEM)—Cross-section TEM can provide valuable information on the growth mechanism. Lattice images can show how material growth proceeds. Defects such as dislocations and stacking faults can be imaged and analyzed. TEM studies will be critical to understanding the strain relaxation mechanism during growth.

Resistance measurement—Device resistance measurements may be useful. Series resistance due to the bulk material and contacts should be reduced to improve efficiency under solar concentration.

I-V curve—Measurement of the device I-V curve under solar illumination will reveal the $J_{sc}$, $\phi_{oc}$ and ff values that can often largely affect device performance Embodiment of the present methods be configured to include and/or enable the growth and characterization of high quality un-doped and doped $In_xGa_{1-x}N$ ($0 \leq x \leq 1$) nano-columns and micro-columns structures for photovoltaic applications. Embodiments of the present methods and devices can also be configured to include and/or enable the following:

4.1 Growth and study of high quality n- and p-type doped (e.g., with Si, Ge, Mg) and un-doped GaN columns by chemical vapor deposition in a three-zone horizontal quartz tube reactor using UHP ammonia (730 Torr) as carried gas at temperatures between 600 and 900° C.

4.2 Growth of high quality doped and undoped InN columns by chemical vapor deposition in a three-zone horizontal quartz tube reactor using UHP ammonia (730 Torr) as carried gas at temperatures between 500 and 700° C.

Figure 13:
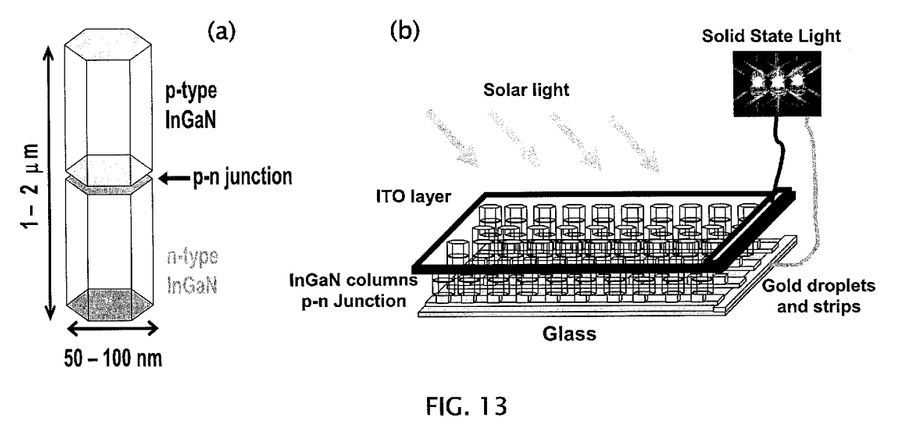
FIG. 13: Schematic of the InGaN column p-n junction. (b) Schematic of the InGaN-based PV cell.
Figure 14:
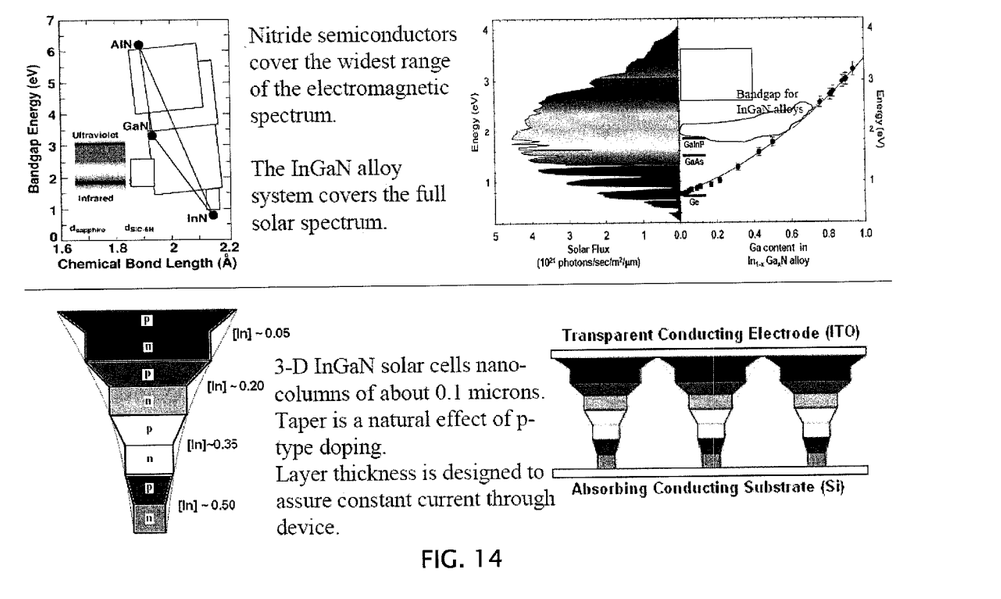
FIG. 14: Depicts examples of "tapered" embodiments of the present structures. Several p-n junctions are shown, with different Indium composition. Examples of nanowires structure due to doping type-dependent lateral growth is shown. Each pn "sub-cell" may be coupled by a tunnel junction.

4.3 Growth and/or study of high quality n-p $In_xGa_{1-x}N$ junctions by chemical vapor deposition in a three-zone horizontal quartz tube reactor using UHP ammonia (730 Torr) as carried gas at temperatures between 600 and 900° C. A model of one example of a p-n junction is shown in FIG. 13 (a).

4.4 Fabrication of photovoltaic (PV) devices and their evaluation will represent an important stage in this research. A model of one of the present PV devices that is partially similar in some respects to one presented by Law et al. in [14] is shown in FIG. 13 (b).

Structural and optical characterizations of the $In_xGa_{1-x}N$ crystallites may be carried out just after the synthesis using the currents analysis techniques such as: energy dispersive spectroscopy, UV-visible spectroscopy, infrared and Raman spectroscopy, scanning electron microscopy, transmission electron microscopy, X-ray diffraction, photoluminescence, cathodoluminescence and electroluminescence. Electrical measurements, such as Hall-effect, resistance, and I-V curves, may be carried out on embodiments of the InGaN-based devices.

All of the compositions and/or methods disclosed and claimed herein can be made and executed without undue experimentation in light of the present disclosure. While the compositions and methods of this invention have been described in terms of some embodiments, it will be apparent to those of skill in the art that variations may be applied to the compositions and methods and in the steps or in the sequence of steps of the method described herein without departing from the concept, spirit and scope of the invention. More specifically, it will be apparent that certain agents which are both chemically and physiologically related may be substituted for the agents described herein while the same or similar results would be achieved. All such similar substitutes and modifications apparent to those skilled in the art are deemed to be within the spirit, scope and concept of the invention as defined by the appended claims.

REFERENCES

The following references, to the extent that they provide exemplary procedural or other details supplementary to those set forth herein, are specifically incorporated herein by reference at the locations at which they have been cited.

[1] Bedair et al., *Appl. Phys. Lett.*, 34:38, 1979.
[2] Bube, Richard H., *Photovoltaic Materials*, Imperial College Press, 1998.
[3] Garcia et al., In: *Light emission from GaN microcrystals*, Proc., Int. Conf. on the Physics of Semiconductors (ICPS-27), AIP Conf. Proc. Q5.234-040248, 2005.
[4] Garcia et al., *J. Crystal Growth*, 304:225, 2007.
[5] Garcia et al., *Mat. Res. Soc. Symp. Proc.*, 798:Y10.75.1-6, 2004.
[6] Garcia et al., *Mat. Res. Soc. Symp. Proc.*, 864:E6.10.1, 2005.
[7] Garcia et al., *Mat. Sci. Engineering*. B, 90:7, 2002.
[8] Garcia et al., *Method to synthesize highly luminescent magnesium-doped gallium nitride powders*, USPTO application Ser. No. 10/589,541, filed Aug. 16, 2006.
[9] Garcia et al., *Optical Materials*, 29:19, 2006.
[10] Green et al., *Research and Applns.*, 13:387, 2005.
[11] Karam et al., *Solar Energy Mat. Solar Cells*, 66:453, 2001.
[12] Kaufmann et al., *Appl. Phys. Lett.*, 72:1326, 1998.
[13] Khan et al., *Appl. Phys. Lett.*, 85:3098, 2004.
[14] Law et al., *Nature Mat.*, 4:455, 2005.
[15] Massalski et al., In: *Binary Alloy Phase Diagrams*" (ASM International, Materials Park, Ohio, 1990), 1822-3.
[16] Monemar, *Condens. Matter*, 13:7011, 2001.
[17] Ozden et al., *Phys. Stat. Sol.*, 188(1):139-142, 2001.
[18] Ponce and Bour, *Nature*, 386:351, 1997.
[19] Ponce et al., In: *Two-step process for direct synthesis of gallium nitride powders*, U.S. Pat. No. 7,255,844, issued Aug. 14, 2007.
[20] Red'kin et al., *Inorg. Mater.*, 40:1197, 2004.
[21] Takamoto et al., *Research and Applns.*, 13:495, 2005.
[22] Takeuchi et al., *Jpn. J. Appl. Phys.*, 40 (2001): L861-L863, 2001.
[23] Thomas et al., $Ga_xIn_{1-x}N$ *phosphor film growth process and devices*, Invention disclosure submitted, Sep. 11, 2006.
[24] U.S. Pat. No. 6,724,013
[25] Van de Walle and Neugebauer, *J. Appl. Phys.*, 95:3851, 2004.
[26] Van de Walle et al., *J. Crystal Growth*, 189/190:505, 1998.
[27] Wagner and Ellis, *Appl. Phys. Lett.*, 4:89, 1964.
[28] Woodall and Hovel, *Appl. Phys. Lett.*, 21:379, 1972.
[29] Wu et al., *J. Appl. Phys.*, 94:6477, 2003.
[30] Yamaguchi et al., *Solar Energy*, 79:78, 2005.
[31] Garcia et al., *J. Crystal Growth*, 310:3131, 2008.

The invention claimed is:

1. A method for growing GaN nanocolumns comprising:
depositing a gold layer on a silica substrate;
annealing the gold layer to form regions configured to act as catalyst and nucleation sites for GaN growth; and
performing a Ga—Mg alloy deposition process that is configured to form p-type GaN columns on the gold layer;
where performing the Ga—Mg alloy deposition process comprises:
flushing a collection of the deposited gold layer, Ga—Mg alloy, and ammonium chloride salt with nitrogen in a vacuum environment;
exposing the collection to temperature of about 900° C.; and
introducing a flow of ammonia to the collection.

2. The method of claim 1, where the collection is exposed to a temperature of 900° C. and to the flow of ammonia until at least a portion of the p-type GaN columns coalesce into a continuous film layer.

3. The method of claim 2, where the at least a portion of the p-type GaN columns coalesce into a continuous film layer having a thickness greater than about 15 μm.

4. The method of claim 3, where the at least a portion of the p-type GaN columns coalesce into a continuous film layer having a thickness greater than about 25 μm.

5. The method of claim 2, where the Ga—Mg alloy deposition process further comprises decomposing $NH_4Cl$ to release ammonia.

6. The method of claim 2, further comprising:
exposing the substrate to a temperature lower than 900° C.;
where exposing the substrate is performed after at least a portion of the columns have coalesced into a continuous layer.

7. The method of claim 2, further comprising:
introducing a flow of $N_2$ to the substrate.

8. The method of claim 7, where the flow of $N_2$ is continued until the columns have cooled to ambient temperature.

9. The method of claim 2, further comprising:
removing the film layer from the substrate using ultrasonication with a washing fluid comprising hydrofluoric acid.

10. A method for growing nanocolumns comprising:
providing a first silica substrate having a gold layer with annealed regions configured to act as catalyst and nucleation sites for alloy growth;
performing an alloy-deposition process that is configured to form alloy columns on the gold layer of the first silica substrate;
where performing the alloy-deposition process comprises depositing metal alloy on the gold layer of the substrate, the metal alloy comprises at least one of: In, Ga, or Ga—Mg alloy, and performing the alloy-deposition process comprises:
flushing a collection of the deposited gold layer of the silica substrate, alloy, and ammonium chloride salt with nitrogen in a vacuum environment;

exposing the collection to temperature of about 900° C.; and introducing a flow of ammonia to the collection.

11. The method of claim 10, where the alloy columns are p-type alloy columns.

12. The method of claim 11, where the collection is exposed to a temperature of 900° C. and to the flow of ammonia until at least a portion of alloy columns coalesce into a continuous layer.

* * * * *

UNITED STATES PATENT AND TRADEMARK OFFICE
CERTIFICATE OF CORRECTION

PATENT NO. : 8,529,698 B2  
APPLICATION NO. : 12/616634  
DATED : September 10, 2013  
INVENTOR(S) : Fernando A. Ponce et al.

It is certified that error appears in the above-identified patent and that said Letters Patent is hereby corrected as shown below:

In the Claims

In claim 1, column 12, line 24, delete "C." and insert -- C -- therefor.

In claim 2, column 12, line 28, delete "C." and insert -- C -- therefor.

In claim 6, column 12, line 41, delete "C." and insert -- C -- therefor.

In claim 10, column 13, line 1, delete "C." and insert -- C -- therefor.

In claim 12, column 13, line 7, delete "C." and insert -- C -- therefor.

Signed and Sealed this  
Nineteenth Day of November, 2013

Teresa Stanek Rea  
*Deputy Director of the United States Patent and Trademark Office*